United States Patent [19]
Yamamura

[11] Patent Number: 5,959,561
[45] Date of Patent: Sep. 28, 1999

[54] DIGITAL ANALOG CONVERTER WITH MEANS TO OVERCOME EFFECTS DUE TO LOSS OF PHASE INFORMATION

[76] Inventor: Yasuo Yamamura, West Wing, Wardour Castle, Tisbury, Salisbury, Wiltshire SP3 6RH, United Kingdom

[21] Appl. No.: 08/913,313
[22] PCT Filed: Mar. 11, 1996
[86] PCT No.: PCT/GB96/00561
  § 371 Date: Jan. 6, 1998
  § 102(e) Date: Jan. 6, 1998
[87] PCT Pub. No.: WO96/28891
  PCT Pub. Date: Sep. 19, 1996
[30] Foreign Application Priority Data

Mar. 13, 1995 [GB] United Kingdom .................... 9505015

[51] Int. Cl.⁶ .................................................. H03M 1/06
[52] U.S. Cl. ......................................... 341/118; 341/144
[58] Field of Search .................................... 341/118, 120, 341/144, 145

[56] References Cited

U.S. PATENT DOCUMENTS

| | | | |
|---|---|---|---|
| 4,618,851 | 10/1986 | Watanabe | 341/144 |
| 4,808,998 | 2/1989 | Yamada | 341/118 |
| 4,933,675 | 6/1990 | Beard | 341/110 |
| 4,947,172 | 8/1990 | Suzuki | 341/145 |
| 4,967,197 | 10/1990 | Peng | 341/118 |
| 5,012,242 | 4/1991 | Yoshio et al. | 341/131 |

FOREIGN PATENT DOCUMENTS

| | | |
|---|---|---|
| 0 481 626 | 4/1992 | European Pat. Off. . |
| 0 614 284 | 9/1994 | European Pat. Off. . |
| 1 404 768 | 9/1975 | United Kingdom . |
| 2 215 543 | 9/1989 | United Kingdom . |

*Primary Examiner*—Marc S. Hoff
*Attorney, Agent, or Firm*—Young & Thompson

[57] ABSTRACT

A circuit (20) for converting digital data representing audio as a multiplicity of sample values into an analogue audio signal includes a delay store (22) and a sample store (23). Both stores (22,23) store incoming data. The data in the sample store (23) is processed by a comparator (24) and a synthesizer (25) which generates a correcting signal (33). The same data in the delay store (22) is delayed to permit generation of the correcting signal and is output to a digital to analogue converter (27) where it is converted into a decoded analogue signal. The correcting signal is added to the decoded analogue signal in a mixer (26) to produce a combined signal for output as the analogue audio signal. The decoded analogue signal from the digital to analogue converter (27) does not include clearly defined zero crossing points. The correcting signal includes a zero crossing point and thus the output analogue audio signal from the mixer includes a zero crossing point, which improves the quality of the audio during playback.

18 Claims, 4 Drawing Sheets

DIGITAL ANALOG CONVERTER WITH MEANS TO OVERCOME EFFECTS DUE TO LOSS OF PHASE INFORMATION

The invention relates to a digital to analogue converter. More specifically the invention relates to a circuit for converting digital data representing audio as a multiplicity of sample values into an analogue audio signal.

Compact discs are now used extensively as a recording medium for audio signals. Compact discs provide a good, robust storage medium for and enable high quality playback of audio signals.

FIGS. 1 to 3 of the accompanying drawings illustrate generally the process by which an audio signal is converted into digital data. An original audio signal is represented by the plot in FIG. 1. The audio signal is continuous and has a zero value, i.e. it crosses the horizontal time axis 2 at an instant of time $T_0$. As shown in FIG. 2, the analogue signal 1 is sampled at regularly spaced instances 3 to 6. Each sample has a level 7 to 10 which is converted into digital data having values corresponding to the levels. During playback the digital data is converted into a decoded analogue signal 11 such as shown in FIG. 3. The decoded analogue signal 11 is a stepwise approximation of the original analogue signal 1. It will, of course, be appreciated that the distance between adjacent levels represented by the digital data is in fact very small and that the steps shown in the decoded analogue signal of FIG. 3 have been exaggerated for the purpose of illustration only.

One of the limitations of representing an analogue signal in digital form is that some of the information in the original signal is lost. For example, frequency components greater than 22 kHz cannot be retrieved from the digital data. Also, the exact instances $T_0$ at which zero crossings occur are not known. FIG. 4 shows one example of a signal 12 crossing zero at a point $T_0$ and a decoded analogue signal 13 having a zero period $P_0$ corresponding to the time interval between consecutive samples of the digital data. The zero crossing point $T_0$ of the original analogue signal 12 happens to coincide with a sampling instant. In FIG. 5 an original analogue signal 14 has a zero crossing point which happens to fall between two sampling instances and has a slope which results in sample values of zero on each side of the zero crossing. Consequently, the decoded analogue signal 15 has a zero period $P_0$ corresponding to two sampling periods. That is to say, in the situation shown in FIG. 5 zero period $P_0$ corresponding to the zero crossing point $T_0$ is exaggerated further as compared to the situation shown in FIG. 4.

Generally, it is believed that the loss of accurate zero crossings in the decoded analogue signal is unimportant. The human ear did not evolve to detect zero crossings and so a listener should not be able to sense them in the decoded audio during playback. However, research has shown that whilst zero crossings cannot be sensed, they are nevertheless perceived during playback on expensive, high quality audio equipment. The perception is that something is not quite right with the playback. Loss of a zero crossing results in a temporary loss of phase information and it may be that loss which is being perceived by the listener.

The present invention aims to overcome or at least reduce the above-discussed problems without the need to redefine the coding standard used in audio compact discs.

According to one aspect of the invention there is provided a circuit for converting digital data representing audio as a multiplicity of sample values into an analogue audio signal, the circuit comprising: a store for storing plural sample values; a signal generator for generating a correcting signal having a level depending on the sign of each of the stored sample values; a digital to analogue converter for creating an analogue signal from the stored sample values; and a combiner for combining the correcting signal with the analogue signal to produce a combined signal for output as the analogue audio signal.

According to another aspect of the invention there is provided a circuit in which digital data representing sample values of an original analogue signal is processed to determine instances at which the original analogue signal crosses a zero level and to generate a zero crossing signal representative thereof for combination with an analogue signal decoded from the digital data.

According to another aspect of the invention there is provided a method of converting digital data representing audio as a multiplicity of sample values into an analogue audio signal, the method comprising: storing plural sample values; generating a correcting signal having a level depending on the sign of each of the stored sample values; creating an analogue signal from the stored sample values; and combining the correcting signal with the analogue signal to produce a combined signal for output as the analogue audio signal.

According to a further aspect of the invention there is provided a method in which digital data representing sample values of an original analogue signal is processed to determine instances at which the original analogue signal crosses a zero level and to generate a zero crossing signal representative thereof for combination with an analogue signal decoded from the digital data.

The above and further features of the invention are set forth with particularity in the appended claims and together with advantages thereof will become clearer from consideration of the following detailed description of an exemplary embodiment of the invention given with reference to the accompanying drawings:

Figure 1:
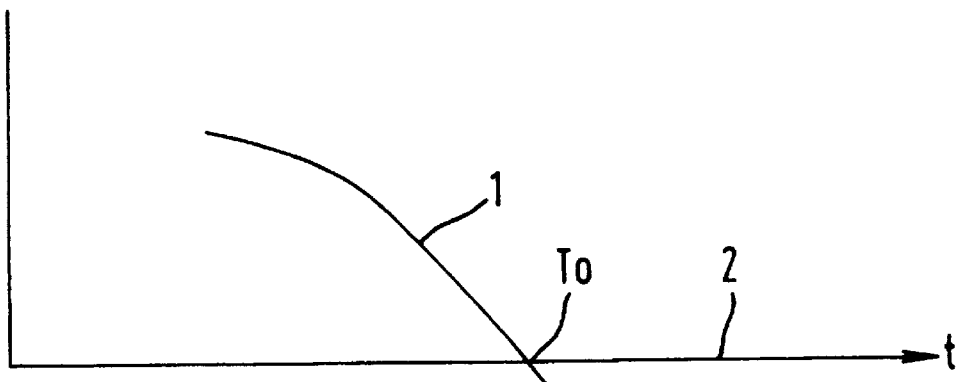
FIG. 1 is a graph of an analogue audio signal as already discussed herein.
Figure 2:
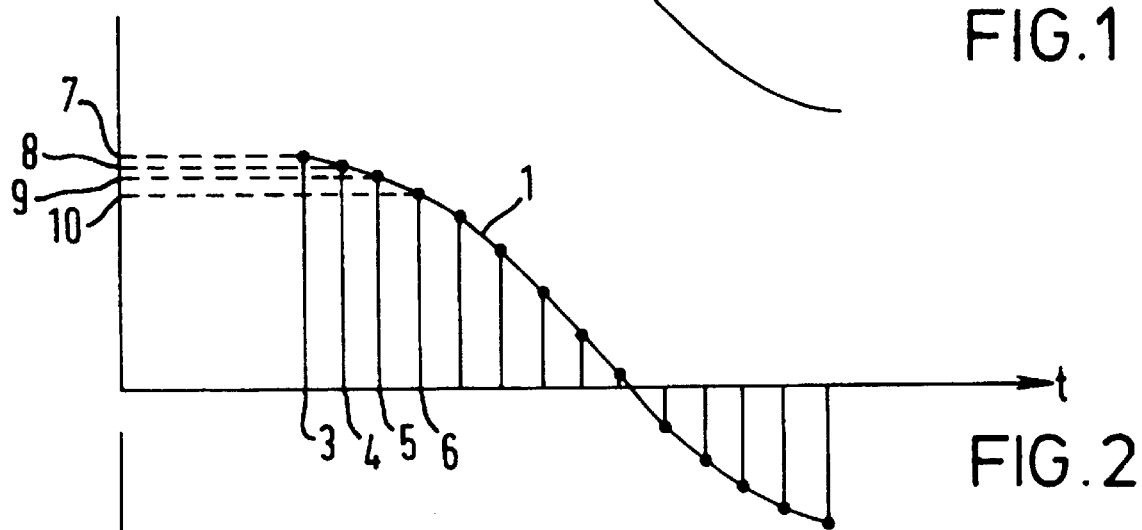
FIG. 2 is a plot illustrating sampling of the analogue signal of FIG. 1 as already discussed herein.
Figure 3:
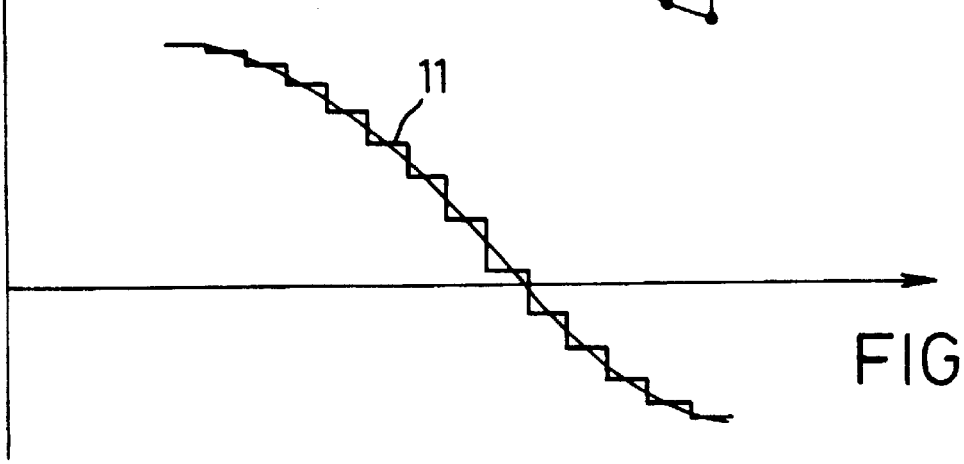
FIG. 3 is a plot of a decoded analogue signal as already discussed herein.
Figure 5:
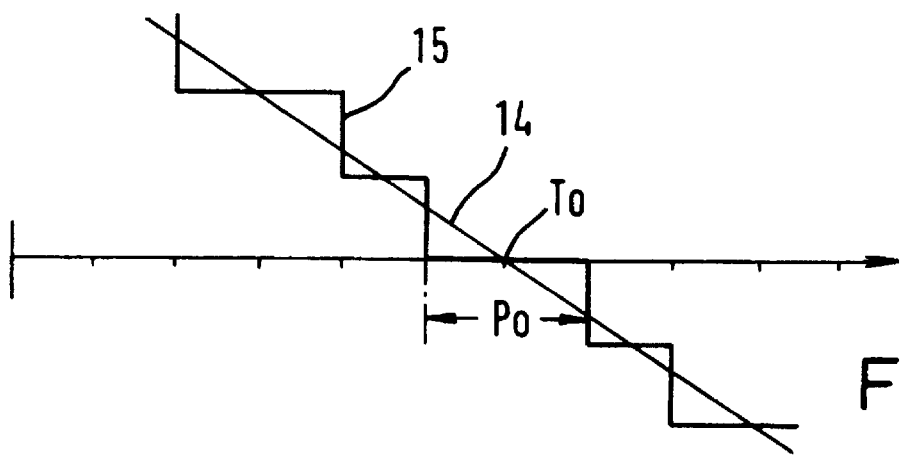
FIG. 5 is a plot of another zero crossing in a decoded analogue signal as already discussed herein.
Figure 4:
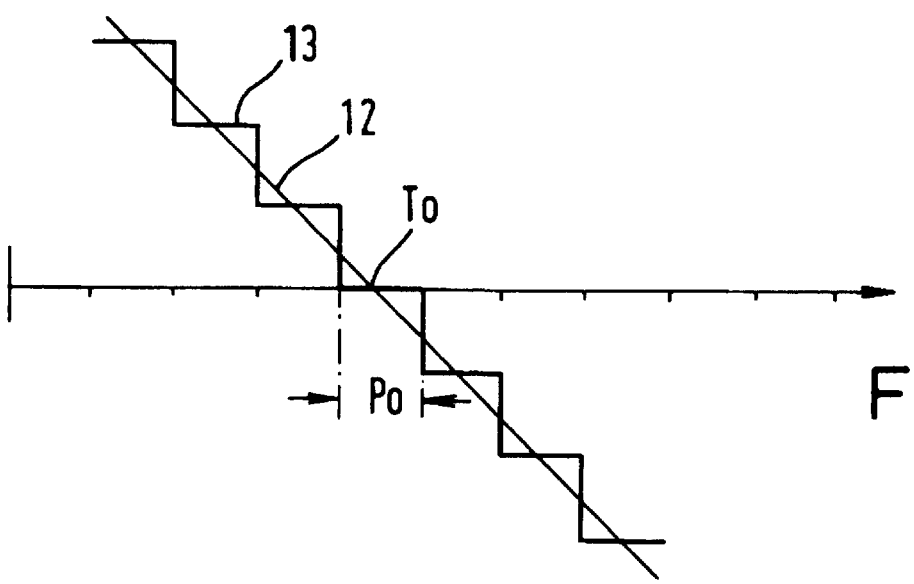
FIG. 4 is a plot of a zero crossing in a decoded analogue signal as already discussed herein.
Figure 6:
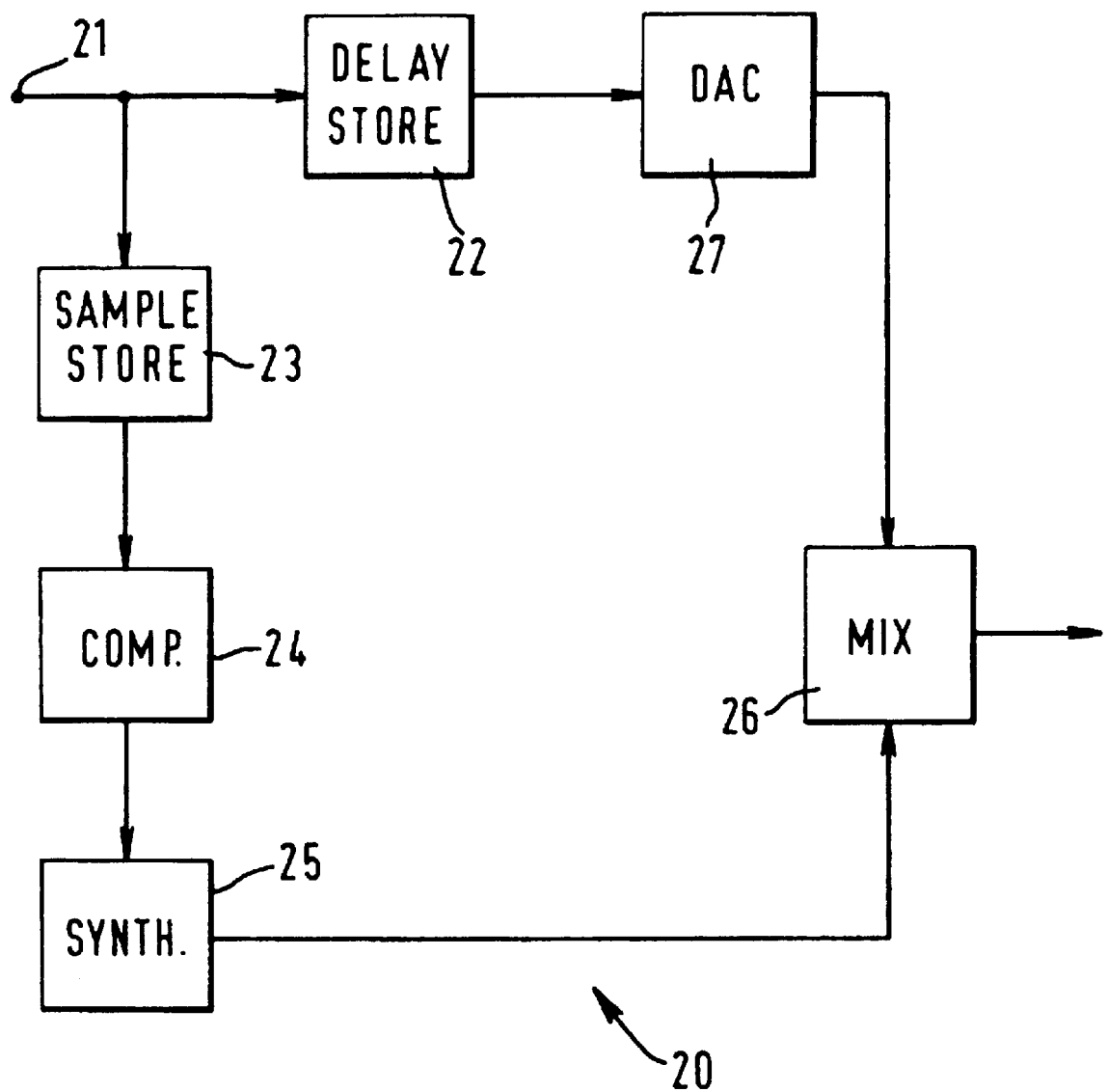
FIG. 6 is a schematic diagram of a circuit embodying the invention.

Referring now to FIG. 6 of the drawings, there is shown a circuit 20 having an input 21 for receiving digital data representing audio as a multiplicity of sample values. The digital data is input to a delay store 22 and a sample store 23. Each of the stores 22, 23 has sufficient capacity to store data representing several samples during processing. Data from the sample store 23 is input to a comparator circuit 24. The sign of the sample represented by the data (positive or negative) is examined by the comparator which outputs a signal representative of the sign to a signal synthesizer 25. Together, the comparator 24 and the synthesizer 25 serve as a signal generator for generating a correcting signal which is output to a mixer 26.

The delay store 22 serves as a temporary store for input data while that data is being processed by the comparator 24 and synthesizer 25. The delay store 22 outputs digital data to a digital to analogue converter (DAC) 27 where it is converted into an analogue signal having a level corresponding to the value represented by the digital data. The analogue signal from the DAC 27 is also input to the mixer 26. The mixer 26 serves to combine the analogue signal from the DAC 27 and the correction signal from the synthesizer 25 to produce a corrected signal which is output from the mixer for amplification and reproduction of the audio represented thereby.

Figure 7:
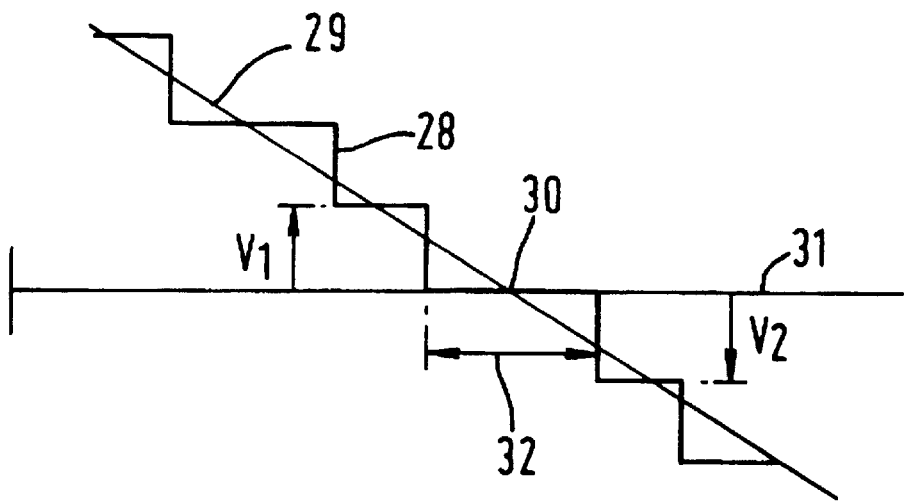
FIG. 7 is a plot of a decoded analogue signal similar to that shown in FIG. 5.

FIG. 7 of the accompanying drawings illustrates a portion of a decoded analogue signal 28 which is output from the DAC 27. Also shown in FIG. 7 is a corresponding portion of the original analogue signal 29. The original analogue signal 29 has a zero crossing point 30 at the horizontal axis 31 of the graph. The decoded analogue signal, in contrast, has a zero period 32 corresponding to two sampling periods. There is therefore a discontinuity of the information in the decoded analogue signal 28 during the period 32.

Figure 8:
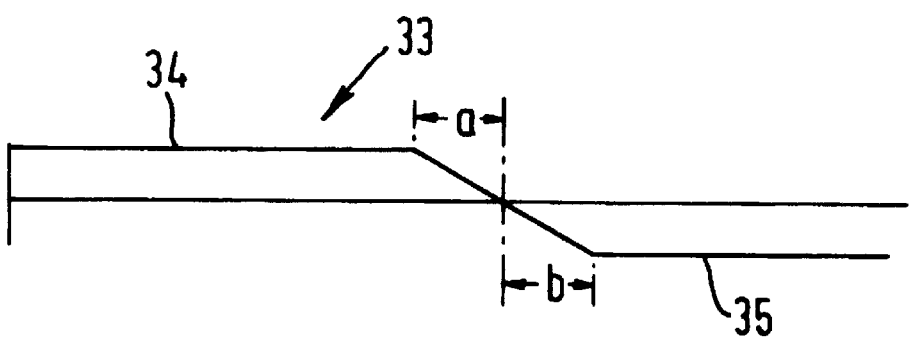
FIG. 8 is a graph of a correcting signal generated in the circuit of FIG. 6.

FIG. 8 of the accompanying drawings illustrates a correction signal 33 which is output from the synthesizer 25. When the sign of the sample represented by the digital data is positive the correction signal 33 is also positive of a level 34 corresponding to a least positive sample value above zero representable by the digital data. When the sign golf the sample represented by t he digital data is negative then the correcting signal 33 also is negative and has a level 35 corresponding to the least negative sample value below zero representable by the digital data. During the period 32 the correcting signal continuously changes gradually between the positive level 34 and the negative level 35.

Figure 9:
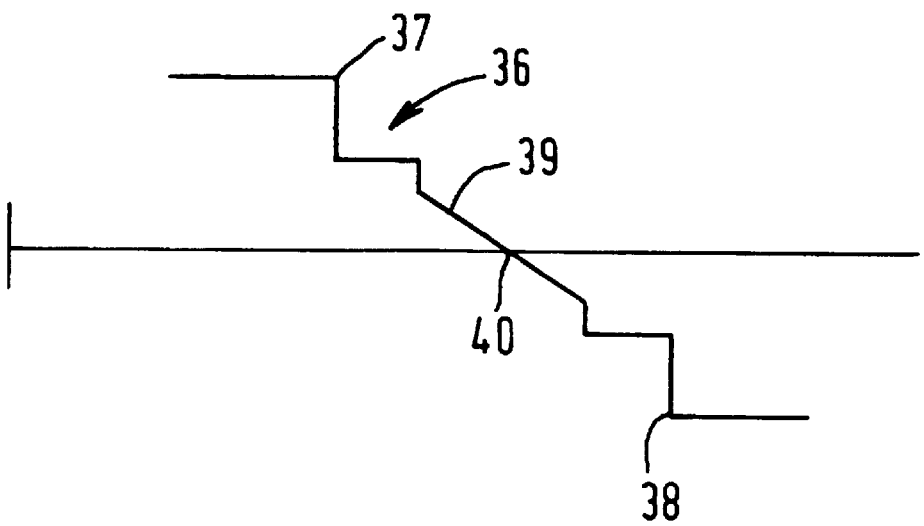
FIG. 9 is a plot of a corrected decoded analogue signal output from the circuit of FIG. 6.

FIG. 9 of the accompanying drawings shows a signal 36 which is output from the mixer 26 once the signal 28 and the signal 33 have been combined. The signal 36 comprises stepwise approximations corresponding to the signal 28 in time periods outside the period 32 and a continuous portion 39 corresponding to the correction signal 33 during the time period 32. Thus, the output signal 36 has a zero crossing point 40 corresponding to the incident at which the value of the correcting signal 33 is zero.

In its simplest form the synthesizer 25 can be arranged to generate a signal with a value which changes from −1 at the beginning of period 32 to −1 at the end of period 32 with the zero crossing occurring in the middle of the period 32. Alternatively, the synthesizer 25 can use a more sophisticated approach such as interpolation to move the zero crossing point of the correcting signal 33 away from the middle of the period 32. In general, if the value of the last positive sample before the period 32 is $V_1$ and the value of the first negative sample (ignoring the sign) after the period 32 is $V_2$ then the interval a in the correcting signal 33 may be calculated from the equation $a=V_1/(V_1+V_2)$, and the interval b may be calculated from $b=V_2/(V_1+V_2)$. The synthesis of a signal from such information is well known and will not be discussed any further herein.

Having thus described the present invention by reference to a preferred embodiment it is to be well understood that the embodiment in question is exemplary only and that modifications and variations such as will occur to those possessed of appropriate knowledge and skills may be made without departure from the spirit and scope of the invention as set forth in the dependent claims and equivalents thereof.

I claim:

1. A circuit for converting digital data representing audio as a multiplicity of sample values into an analogue audio signal, the circuit comprising:

a store for storing plural sample values;

a signal generator for generating a correcting signal having a level depending on the sign of each of the stored sample values;

a digital to analogue converter for creating an analogue signal from the stored sample values; and a combiner for combining the correcting signal with the analogue signal to produce a combined signal for output as the analogue audio signal.

2. A circuit as claimed in claim 1, wherein the store comprises a sample store for storing said plural sample values for generation of the correcting signal and a delay store for storing sample values to delay creation of the analogue signal therefrom by the digital to analogue converter.

3. A circuit as claimed in claim 1, wherein the signal generator comprises a comparator for examining the sign of each of the stored sample values and outputting a signal indicative of the sign.

4. A circuit as claimed in claim 3, wherein the signal generator comprises a synthesizer for synthesizing the correcting signal depending on the signal output from the comparator.

5. A circuit as claimed in claim 4, wherein the synthesizer is arranged to output when the sign of the stored sample values is positive a signal having a level corresponding to the least positive sample value about zero representable by the digital data, and to output when the sign of the stored sample values is negative a signal having a level corresponding to the least negative sample value below zero representable by the digital data.

6. A circuit as claimed in claim 4, wherein the synthesizer is arranged to generate a continuous correcting signal which changes gradually between the positive and negative levels in the period of time between consecutive samples.

7. A circuit as claimed in claim 6, wherein the synthesizer comprises an interpolator for interpolating between values of consecutive samples to control the rate of change of the correcting signal between consecutive samples and thereby to alter the instant when the level of the correcting signal is zero.

8. A circuit as claimed in claim 1, wherein the combiner comprises a mixer.

9. A circuit in which digital data representing sample values of an original analogue signal is processed to determine instances at which the original analogue signal crosses a zero level and to generate a zero crossing signal representative thereof for combination with an analogue signal decoded from the digital data.

10. A method of converting digital data representing audio as a multiplicity of sample values into an analogue audio signal, the method comprising:

storing plural sample values;

generating a correcting signal having a level depending on the sign of each of the stored sample values;

creating an analogue signal from the stored sample values; and combining the correcting signal with the analogue signal to produce a combined signal for output as the analogue audio signal.

11. A method as claimed in claim 10, further comprising storing said plural sample values for generation of the correcting signal and storing sample values to delay creation of the analogue signal therefrom by the digital to analogue converter.

12. A method as claimed in claim 10, further comprising examining the sign of each of the stored sample values.

13. A method as claimed in claim 12, further comprising synthesizing the correcting signal depending on the result of the examination.

14. A method as claimed in claim 13, wherein, when the sign of the stored sample values is positive, a correcting signal is synthesized having a level corresponding to the least positive sample value above zero representable by the digital data, and when the sign of the stored sample values is negative a signal is synthesized having a level corresponding to the least negative sample value below zero representable by the digital data.

15. A method as claimed in claim 13, wherein the synthesized correcting signal changes gradually between the positive and negative levels in the period of time between consecutive samples.

16. A method as claimed in claim 15, further comprising interpolating between values of consecutive samples to control the rate of change of the correcting signal between consecutive samples and thereby to alter the instant when the level of the correcting signal is zero.

17. A method as claimed in claim 10, wherein the correcting signal and the analogue signal are combined by mixing.

18. A method in which digital data representing sample values of an original analogue signal is processed to determine instances at which the original analogue signal crosses a zero level and to generate a zero crossing signal representative thereof for combination with an analogue signal decoded from the digital data.

* * * * *